(12) United States Patent
Chen et al.

(10) Patent No.: US 10,756,121 B2
(45) Date of Patent: Aug. 25, 2020

(54) CONDUCTOR STRUCTURE AND DISPLAY DEVICE

(71) Applicant: Innolux Corporation, Miao-Li County (TW)

(72) Inventors: Ming-Chun Chen, Miao-Li County (TW); Hsu-Min Huang, Miao-Li County (TW); Shih-Sian Yang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/905,799

(22) Filed: Feb. 26, 2018

(65) Prior Publication Data

US 2018/0261629 A1 Sep. 13, 2018

(30) Foreign Application Priority Data

Mar. 9, 2017 (CN) .......................... 2017 1 0136814

(51) Int. Cl.
*H01L 27/12* (2006.01)
*H01L 23/532* (2006.01)
*H01L 27/32* (2006.01)
*G02F 1/1362* (2006.01)
*H01L 51/00* (2006.01)
*H05K 3/06* (2006.01)
*H05K 1/09* (2006.01)
(Continued)

(52) U.S. Cl.
CPC ...... *H01L 27/124* (2013.01); *G02F 1/136259* (2013.01); *G02F 1/136286* (2013.01); *H01L 23/53219* (2013.01); *H01L 23/53223* (2013.01); *H01L 51/0021* (2013.01); *H05K 1/09* (2013.01); *H05K 3/06* (2013.01); *G02F 1/13439* (2013.01); *G02F 2001/136263* (2013.01); *G02F 2001/136295* (2013.01); *H01L 27/308* (2013.01); *H01L 27/3262* (2013.01); *H01L 27/3265* (2013.01); *H01L 27/3276* (2013.01); *H01L 27/3279* (2013.01); *H05K 2201/0352* (2013.01); *H05K 2201/0361* (2013.01); *H05K 2201/09154* (2013.01)

(58) Field of Classification Search
CPC ......... H01L 23/53219; H01L 23/53223; H01L 23/53233; H01L 23/53238; H01L 27/124; H01L 27/3279
See application file for complete search history.

(56) References Cited

U.S. PATENT DOCUMENTS

2008/0014728 A1* 1/2008 Rossi ............... H01L 21/32051
438/582
2013/0302938 A1* 11/2013 Sato .................. H01L 29/66969
438/104
(Continued)

*Primary Examiner* — Phat X Cao
(74) *Attorney, Agent, or Firm* — JCIPRNET

(57) ABSTRACT

A conductor structure includes a first metal layer, a second metal layer, and a controlling layer. The second metal layer is disposed on the first metal layer. A material of the first metal layer and a material of the second metal layer include at least one identical metal element. The controlling layer is disposed between the first metal layer and the second metal layer. A thickness of the controlling layer is less than a thickness of the first metal layer, and the thickness of the controlling layer is less than a thickness of the second metal layer.

11 Claims, 3 Drawing Sheets

(51) Int. Cl.
 *H01L 27/30* (2006.01)
 *G02F 1/1343* (2006.01)

(56) References Cited

U.S. PATENT DOCUMENTS

| | | | |
|---|---|---|---|
| 2015/0179578 A1* | 6/2015 | Jezewski | H01L 23/5329 |
| | | | 257/768 |
| 2016/0013072 A1* | 1/2016 | Sera | H01L 21/32135 |
| | | | 257/751 |
| 2017/0033792 A1* | 2/2017 | Takahashi | H01L 27/1225 |

* cited by examiner

CONDUCTOR STRUCTURE AND DISPLAY DEVICE

CROSS-REFERENCE TO RELATED APPLICATION

This application claims the priority benefit of China application serial no. 201710136814.1, filed on Mar. 9, 2017. The entirety of the above-mentioned patent application is hereby incorporated by reference herein and made a part of this specification.

BACKGROUND OF THE INVENTION

Field of the Invention

The disclosure relates to a conductor structure and a display device including the conductor structure.

Description of Related Art

As the size of display devices increases, the problem of the resistance of metal conductive wires not being low enough follows and thus results in RC delay effect. It causes signals to be distorted during transmission. Through increasing the thickness of the metal conductive wires, the resistance can be lowered to reduce the occurrence of RC delay effect. In the process of manufacturing thicker metal conductive wires, however, protuberances or convex angles are likely to form on the sidewall profile of the metal conductive wires after etching process. As a result, the film layers are disposed afterwards are likely to rupture.

SUMMARY OF THE INVENTION

The disclosure provides a conductor structure and a display device including the conductor structure, wherein protuberances are unlikely to form on a sidewall profile of the conductor structure.

The conductor structure in the disclosure includes a first metal layer, a second metal layer, and a controlling layer. The second metal layer is disposed on the first metal layer. The material of the first metal layer and the material of the second metal layer include at least one identical metal element. The controlling layer is disposed between the first metal layer and the second metal layer. The thickness of the controlling layer is less than the thickness of the first metal layer and the thickness of the controlling layer is less than the thickness of the second metal layer.

The display device in the disclosure includes a first substrate and a second substrate. The second substrate is disposed opposite to the first substrate. At least one of the first substrate and the second substrate includes a conductor structure. The conductor structure includes a first metal layer, a second metal layer, and a controlling layer. The second metal layer is disposed on the first metal layer. The material of the first metal layer and the material of the second metal layer include at least one identical metal element. The controlling layer is disposed between the first metal layer and the second metal layer. The thickness of the controlling layer is less than the thickness of the first metal layer, and the thickness of the controlling layer is less than the thickness of the second metal layer.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
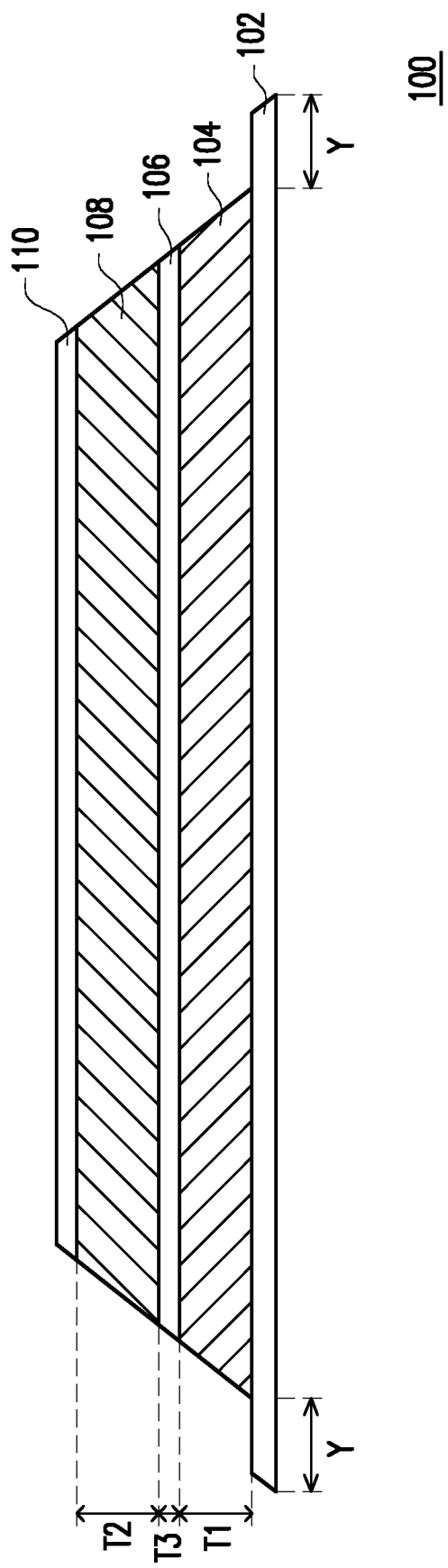
FIG. 1 is a schematic cross-sectional view of a conductor structure in an embodiment of the disclosure.

In the specification, identical or similar reference numerals are used in the figures and descriptions to refer to identical or similar parts where possible.

In the specification, descriptions about forming another structure above a structure or on a structure may include an embodiment, in which the structure and the another structure directly contact each other, or an embodiment, in which an extra structure is formed between the structure and the another structure and hence the structure and the another structure do not directly contact each other.

FIG. 1 is a schematic cross-sectional view of a conductor structure in an embodiment of the disclosure.

Please refer to FIG. 1. In the embodiment of the disclosure, a conductor structure 100 includes a first metal layer 104, a second metal layer 108, and a controlling layer 106. To be more specific, the second metal layer 108 is disposed on the first metal layer 104, and the controlling layer 106 is disposed between the first metal layer 104 and the second metal layer 108 in the embodiment of the disclosure. In other words, in this embodiment, the first metal layer 104, the controlling layer 106 and the second metal layer 108 are sequentially disposed to form a sandwich structure.

In the embodiment of the disclosure, the material of the first metal layer 104 and the material of the second metal layer 108 include at least one identical metal element. For instance, in an embodiment, if the material of the first metal layer 104 is pure aluminum, the material of the second metal layer 108 may be pure aluminum or an alloy of aluminum such as an aluminum-neodymium (Al—Nd) alloy. For another example, in an embodiment, if the material of the first metal layer 104 is pure copper, the material of the second metal layer 108 may be pure copper or an alloy of copper such as a copper-titanium (Cu—Ti) alloy. To specify, the material of the first metal layer 104 in the embodiment includes, for example (but not limited to), pure aluminum, pure copper, an alloy of aluminum, or an alloy of copper. The alloy of aluminum is, for example (but not limited to), an aluminum-neodymium (Al—Nd) alloy. The alloy of copper is, for example (but not limited to), a copper-titanium (Cu—Ti) alloy. The material of the second metal layer 108 in the embodiment includes, for example (but not limited to), pure aluminum, pure copper, an alloy of aluminum, or an alloy of copper. The alloy of aluminum is, for example (but not limited to), an aluminum-neodymium (Al—Nd) alloy. The alloy of copper may be (but not limited to) a copper-titanium (Cu—Ti) alloy.

Moreover, in the embodiment of the disclosure, the thickness difference (|T1−T2|) between the first metal layer 104 and the second metal layer 108 is, for example, less than or equal to 500 Å, such as 50 Å, 100 Å, 200 Å, 300 Å or 400 Å. The thickness difference is an absolute value that excludes a negative value. That is to say, the thickness of the first metal layer 104 and the thickness of the second metal layer 108 may be the same or different in the embodiment. To specify, the thickness T1 of the first metal layer 104 in the embodiment is, for example, in a range of 100 Å to 10000 Å, such as 500 Å, 1000 Å, 3000 Å, 5000 Å, 6000 Å, or 8000 Å. The thickness T2 of the second metal layer 108 in the embodiment is, for example, in a range of 100 Å to 10000 Å, such as 500 Å, 1000 Å, 3000 Å, 5000 Å, 6000 Å, or 8000 Å. It should be noted that when the thickness T1 of the first metal layer 104 is in a range of 2000 Å to 10000 Å and the thickness T2 of the second metal layer 108 is in a range of 2000 Å to 10000 Å, the conductor structure 100 has high film thickness.

In the embodiment of the disclosure, the thickness T3 of the controlling layer 106 is less than the thickness T1 of the first metal layer 104, and the thickness T3 of the controlling layer 106 is less than the thickness T2 of the second metal layer 108. To specify, the thickness T3 of the controlling layer 106 in the embodiment is, for example, in a range of 100 Å to 1000 Å, such as 250 Å, 400 Å, 600 Å or 800 Å. In one example, the thickness T3 of the controlling layer 106 is in a range of 100 Å to 500 Å.

Additionally, the material of the controlling layer 106 in the embodiment of the disclosure includes, for example, a nitride, an oxide, an oxynitride, an aluminum-neodymium alloy, or a combination thereof. The nitride in the embodiment of the disclosure may be, for example, a metal nitride including molybdenum nitride, etc. Nevertheless, the disclosure is not limited to the above. The oxide in the embodiment of the disclosure may be, for example, a metal oxide including molybdenum oxide, etc. Nevertheless, the disclosure is not limited to the above. The oxynitride in the embodiment of the disclosure may be, for example, a metal oxynitride including molybdenum oxynitride, etc. Nevertheless, the disclosure is not limited to the above.

In the embodiment of the disclosure, the conductor structure 100 may further include a bottom conductor layer 102 to enhance an adhesive force between the conductor structure 100 and a substrate that carries the conductor structure 100 or to prevent metal atoms in the first metal layer 104 or in the second metal layer 108 from diffusing to other film layers. To be more specific, the first metal layer 104 is disposed between the bottom conductor layer 102 and the controlling layer 106 in the embodiment of the disclosure. In other words, the bottom conductor layer 102 is disposed underneath the first metal layer 104.

Moreover, in the embodiment, the edge of the bottom conductor layer 102 is protruded beyond the edge of the first metal layer 104. That is to say, part of the bottom conductor layer 102 is not covered by the first metal layer 104. To specify, a distance Y exists between the edge of the bottom conductor layer 102 and the edge of the first metal layer 104. The distance Y is, for example, greater than 0 and less than or equal to 1 μm.

Additionally, the material of the bottom conductor layer 102 in the embodiment includes, for example (but not limited to), a molybdenum nitride, molybdenum, or titanium. The thickness of the bottom conductor layer 102 is, for example, in a range of 100 Å to 500 Å in the embodiment of the disclosure, such as 200 Å or 400 Å.

In the embodiment of the disclosure, the conductor structure 100 may further include a top conductor layer 110 to prevent the metal atoms in the second metal layer 108 from diffusing along a boundary of crystal grains and leading to the formation of a hillock, or to prevent the metal atoms in the first metal layer 104 or in the second metal layer 108 from diffusing to other film layers. To be more specific, the second metal layer 108 is disposed between the controlling layer 106 and the top conductor layer 110 in the embodiment of the disclosure. That is to say, the top conductor layer 110 is disposed on the second metal layer 108 in the embodiment of the disclosure. Furthermore, in the embodiment of the disclosure, the material of the top conductor layer 110 includes, for example (but not limited to), a molybdenum nitride, molybdenum, or titanium. The thickness of the top conductor layer 110 is, for example, in a range of 100 Å to 1000 Å in the embodiment of the disclosure, such as 250 Å, 400 Å, 600 Å or 800 Å.

It should be noted that the conductor structure 100 in the embodiment of the disclosure includes the first metal layer 104, the controlling layer 106, and the second metal layer 108 disposed in order, wherein the material of the first metal layer 104 and the material of the second metal layer 108 include at least one identical metal element, and the thickness T3 of the controlling layer 106 is less than the thickness T1 of the first metal layer 104, and the thickness T3 of the controlling layer 106 is less than the thickness T1 of the second metal layer 108, and thereby through adjustment to conditions in an etching process during manufacturing of the conductor structure 100, protuberances or convex angles are unlikely to form on a sidewall profile of the conductor structure 100 or a sidewall of the conductor structure 100 may possess an appropriate taper profile. For example, in an embodiment, the etching process has the following etching condition: an etching rate of an etchant to the top conductor layer 110> an etching rate of the etchant to the second metal layer 108> an etching rate of the etchant to the controlling layer 106> an etching rate of the etchant to the first metal layer 104> an etching rate of the etchant to the bottom conductor layer 102. It should be noted that the sidewall of the conductor structure 100 has the taper profile, which indicates that a base angle smaller than 90 degrees exists between the sidewall of the conductor structure 100 and an upper surface of the substrate that carries the conductor structure 100.

To further elaborate, the conductor structure 100 in the embodiment of the disclosure includes the first metal layer 104, the controlling layer 106, and the second metal layer 108 disposed in order, wherein the material of the first metal layer 104 and the material of the second metal layer 108 include at least one identical metal element, and the thickness T3 of the controlling layer 106 is less than the thickness T1 of the first metal layer 104, and the thickness T2 of the controlling layer 106 is less than the thickness of the second metal layer 108, and thereby protuberances or convex angles are still unlikely to form on the sidewall profile of the conductor structure 100 after the etching process or the sidewall of the conductor structure 100 still possesses the appropriate taper profile despite the high film thickness of the conductor structure 100. Thus, the conductor structure 100 may be applied in display devices of general size and also in display devices of large size.

To be more specific, the conductor structure 100 may be applied in display devices as any conductive components such as an electrode, a conductive wire, etc. That is to say, the conductor structure 100 may be disposed on any substrate in a display device. Please refer to FIG. 2 hereinafter.

Figure 2:
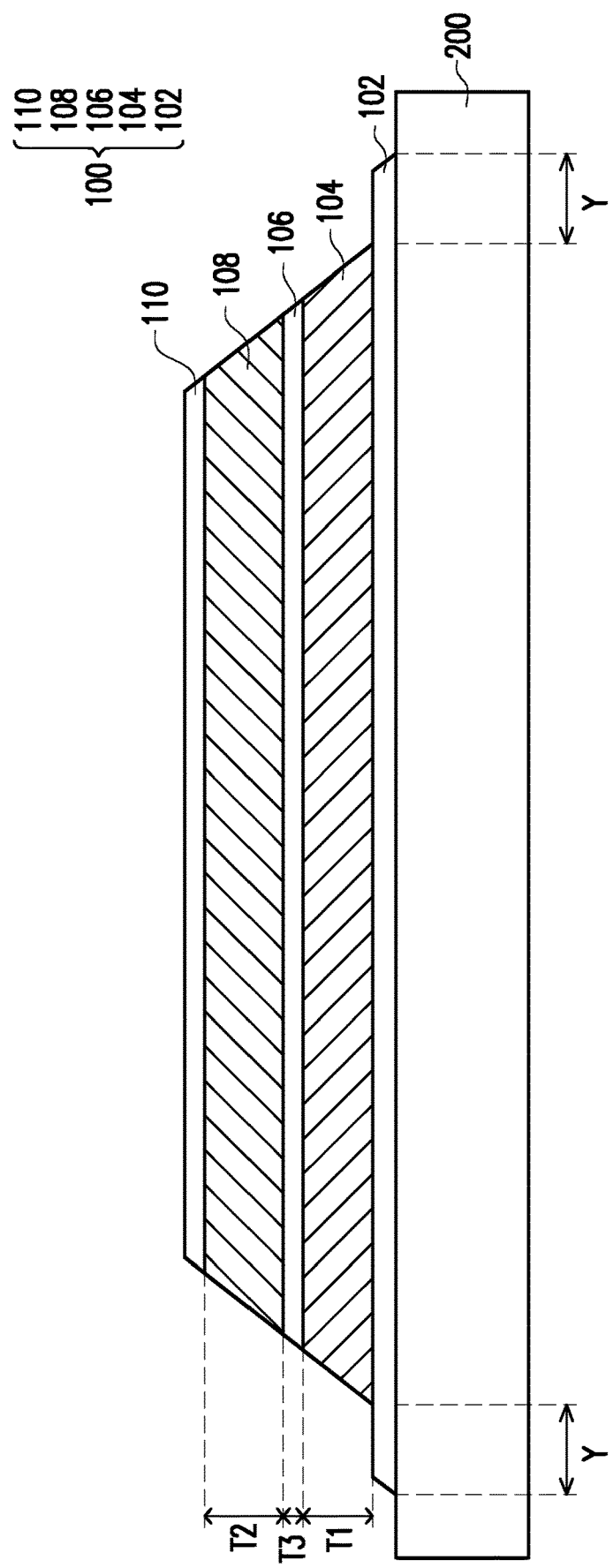
FIG. 2 is a schematic cross-sectional view of a conductor structure disposed on a substrate in an embodiment of the disclosure.

FIG. 2 is a schematic cross-sectional view of a conductor structure disposed on a substrate in an embodiment of the disclosure. Please refer to FIG. 2. The conductor structure 100 is disposed on a substrate 200. In the embodiment of the disclosure, the substrate 200 may be, for example, a substrate of an array substrate or a substrate of an opposite substrate in a display device. The substrate of the array substrate or the substrate of the opposite substrate may be, for example, a blank substrate, on which no other film layers or components are disposed. In the embodiment of the disclosure, the conductor structure 100 may be, for example, at least one conductive component in a component layer disposed on the substrate 200. To be more specific, in the embodiment, the conductor structure 100 may be, for example, at least one conductive component, which needs to adapt high film thickness, in the component layer disposed on the substrate 200. The component layer may be, for example, an active component array layer, a passive component layer, a opposite electrode layer, a sensing component layer, etc.

On the other hand, the display device may be, for example, a sensing display device. Please refer to FIG. 3 and FIG. 4 hereinafter.

Figure 3:
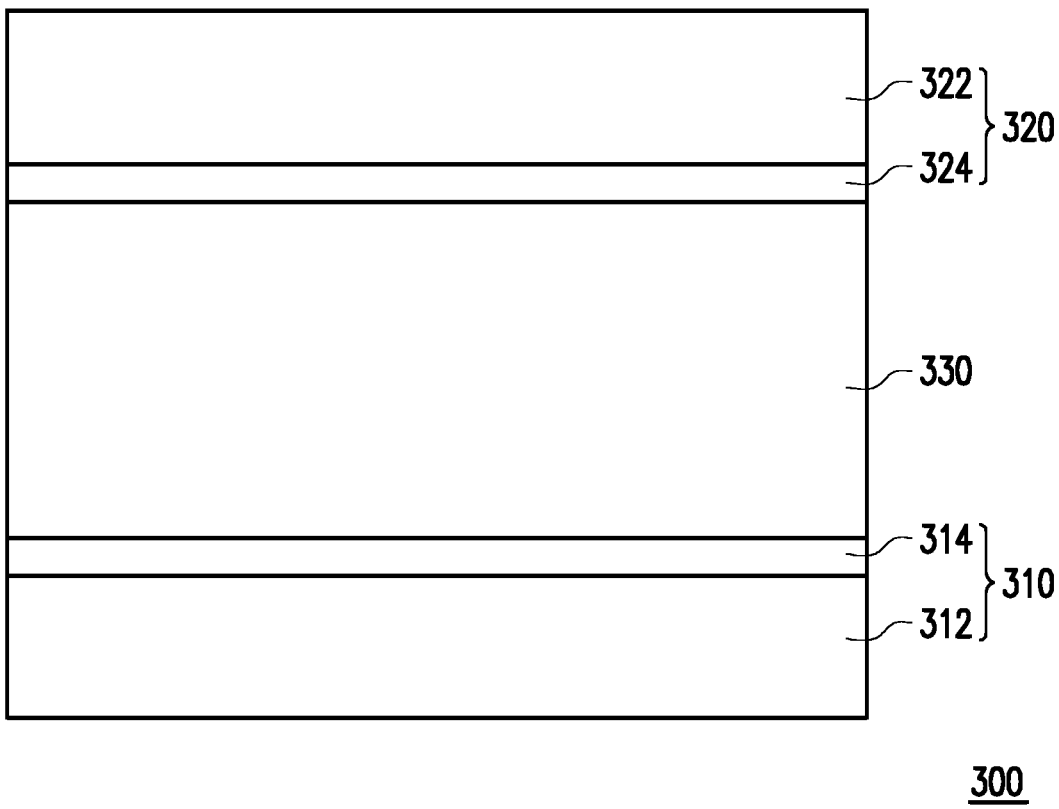
FIG. 3 is a schematic cross-sectional view of a display device in an embodiment of the disclosure.

FIG. 3 is a schematic cross-sectional view of a display device in an embodiment of the disclosure. Please refer to FIG. 3. A display device 300 includes a lower substrate 310, an upper substrate 320 disposed opposite to the lower substrate 310, and a display medium 330 disposed between the lower substrate 310 and the upper substrate 320. To be more specific, in the embodiment, the display device 300 may be, for example (but not limited to), a flexible display device, a touch display device, or a curved display device. In some examples, the above display device may be, for example (but not limited to), a liquid crystal display device, an inorganic light-emitting diode (LED) display device, an organic light-emitting diode (OLED) display device, a micro light-emitting diode display device, a mini light-emitting diode display device, a quantum dot display device, or an active or passive display device of other kinds. The display medium 330 may be, for example (but not limited to), a liquid crystal material, a light-emitting diode (LED) material, an organic light-emitting diode (OLED) material, an inorganic light-emitting diode material, a mini light-emitting diode material, a micro light-emitting diode material, quantum dots material, fluorescence material(s), phosphor material(s), or a display material of other kinds (e.g. an electrowetting display material, an electrophoresis display material, a quantum dot display material, a plasma display material, etc.). In examples, the chip sizes of the light-emitting diode are in a range from about 300 μm to 10 μm, the chip sizes of the mini light-emitting diode are in a range from about 100 μm to 300 μm, and the chip sizes of the micro light-emitting diode are in a range from about 1 μm to 100 μm. The chip sizes of the disclosure are not limited thereto.

The lower substrate 310 in the embodiment of the disclosure is an array substrate. To be more specific, the lower substrate 310 in the embodiment of the disclosure includes a first substrate 312 and a component layer 314 disposed on the first substrate 312. In an embodiment of the disclosure, the first substrate 312 may be, for example, a blank substrate, on which no other film layers or components are disposed. The component layer 314 may include, for example, a plurality of scan lines, a plurality of data lines, a plurality of transistors, a plurality of electrodes, a plurality of capacitors, and at least one insulation layer. Nevertheless, the disclosure is not limited to the above. From another perspective, in an embodiment of the disclosure, the lower substrate 310 may be, for example, an active component array substrate. In another embodiment of the disclosure, the lower substrate 310 may be, for example, a thin-film transistor (TFT) array substrate.

The upper substrate 320 in the embodiment of the disclosure is an opposite substrate. To be more specific, the upper substrate 320 includes a second substrate 322 and a component layer 324 disposed on the second substrate 322. In an embodiment of the disclosure, the second substrate 322 may be, for example, a blank substrate, on which no other film layers or components are disposed. The component layer 324 may include, for example, a color filter layer, a wavelength conversion layer, a light-shielding pattern layer, an opposite electrode layer, and at least one insulation layer. Nevertheless, the disclosure is not limited to the above.

It should be noted that the conductor structure 100 may be applied in display devices as any conductive components such as an electrode, a conductive wire, etc. in the component layer disposed on the substrate 200 as described in the embodiments of FIG. 1 and FIG. 2. As a result, the conductor structure 100 may be used as conductive components which include a scan line, a data line, a gate of a transistor, a source of a transistor, a drain of a transistor, an upper electrode of a capacitor, or a lower electrode of a capacitor, etc. in the component layer 314 of the display device 300. The conductor structure 100 may also be used as conductive components such as a conductive wire used to connect an opposite electrode layer in the component layer 324. In some embodiments, the conductor structure 100 is disposed between the first substrate 312 and the second substrate 322. In one example, the conductor structure 100 is disposed on the first substrate 312 of the lower substrate 310. In another example, the conductor structure 100 is disposed on the second substrate 322 of the upper substrate 320. Descriptions on the conductor structure 100 are given in details in the previous embodiments and hence are not repeated again herein.

Through disposing the conductor structure 100 on at least one of the first substrate 312 and the second substrate 322 in the display device 300 in the embodiment of the disclosure, film layers later disposed on the conductor structure 100 possess appropriate profile and thus are unlikely to rupture. A yield rate in manufacturing the display device 300 is thereby increased.

Figure 4:
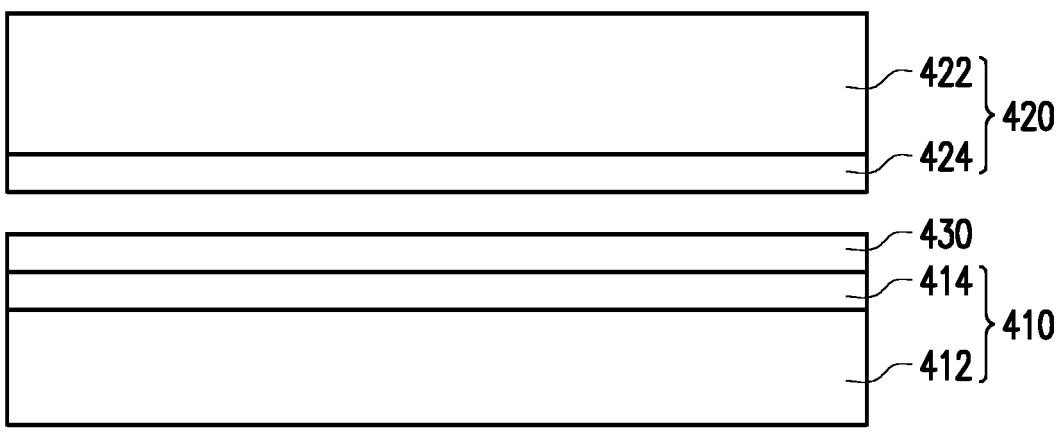
FIG. 4 is a schematic cross-sectional view of a sensing display device in another embodiment of the disclosure.

FIG. 4 is a schematic cross-sectional view of a sensing display device in an embodiment of the disclosure. Please refer to FIG. 4. A sensing display device 400 includes a lower substrate 410, an upper substrate 420 disposed opposite to the lower substrate 410, and a sensing component layer 430 disposed on the lower substrate 410. To be more specific, the sensing display device 400 in the embodiment of the disclosure may be, for example (but not limited to), an X-ray image sensing display device, a touch sensing display device, or an display device after processing sensing. The sensing component layer 430 may include, for example (but not limited to), X-ray sensing units or touch sensing units. Moreover, the sensing component layer 430 is merely disposed on the lower substrate 410 in the embodiment of the disclosure. Nevertheless, the disclosure is not limited to the above. In other embodiments, the sensing component layer 430 may also be disposed on the upper substrate 420 or be disposed on the lower substrate 410 and the upper substrate 420 at the same time according to the actual design or type of the sensing display device 400.

The lower substrate 410 in the embodiment of the disclosure is an array substrate. To be more specific, the lower substrate 410 includes a first substrate 412 and a component layer 414 disposed on the first substrate 412. In an embodiment of the disclosure, the first substrate 412 may be, for example, a blank substrate, on which no other film layers or components are disposed. The component layer 414 may include, for example, a plurality of scan lines, a plurality of data lines, a plurality of transistors, a plurality of electrodes, a plurality of capacitors, and at least one insulation layer. Nevertheless, the disclosure is not limited to the above. From another perspective, in an embodiment of the disclosure, the lower substrate 410 may be, for example, an active component array substrate. In another embodiment of the disclosure, the lower substrate 410 may be, for example, a thin-film transistor array substrate.

In the embodiment of the disclosure, the upper substrate 420 is a opposite substrate. To be more specific, the upper substrate 420 includes a second substrate 422 and a component layer 424 disposed on the second substrate 422. In an embodiment of the disclosure, the second substrate 422 may be, for example, a blank substrate, on which no other film layers or components are disposed. Additionally, the upper substrate 420 in the embodiment of the disclosure includes the second substrate 422 and the component layer 424. Nevertheless, the disclosure is not limited to the above. In other embodiments, the upper substrate 420 may also be a blank substrate, on which no other film layers or components are disposed according to the actual design or type of the sensing display device 400.

It should be noted that the conductor structure 100 may be applied in display devices as any conductive components such as an electrode, a conductive wire, etc. in the component layer disposed on the substrate 200 as described in the embodiments of FIG. 1 and FIG. 2. As a result, the conductor structure 100 may be used as conductive components which include a scan line, a data line, a gate of a transistor, a source of a transistor, a drain of a transistor, an upper electrode of a capacitor, or a lower electrode of a capacitor, etc. in the component layer 414 of the sensing display device 400. The conductor structure 100 may also be used as conductive components such as an electrode or a conductive wire in the sensing component layer 430, or an electrode or a conductive wire in the component layer 424. In some embodiments, the conductor structure 100 is disposed between the first substrate 412 and the second substrate 422. In one example, the conductor structure 100 is disposed on the first substrate 412 of the lower substrate 410. In another example, the conductor structure 100 is disposed on the second substrate 422 of the upper substrate 420. Descriptions on the conductor structure 100 are given in details in the previous embodiments and hence are not repeated again herein.

Therefore, through disposing the conductor structure 100 on at least one of the first substrate 412 and the second substrate 422 in the sensing display device 400 in the embodiment of the disclosure, film layers later disposed on the conductor structure 100 possess better profile and thus are unlikely to rupture. A yield rate in manufacturing the sensing display device 400 is thereby increased.

Based on the above, the conductor structure according to the disclosure includes the first metal layer, the controlling layer, and the second metal layer disposed in order, wherein the material of the first metal layer and the material of the second metal layer include at least one identical metal element and the thickness of the controlling layer is less than the thickness of the first metal layer, and the thickness of the controlling layer is less than the thickness of the second metal layer. Thereby, the above makes protuberances unlikely to form on a sidewall profile of the conductor structure or a sidewall of the conductor structure possess an appropriate taper profile despite the high film thickness of the conductor structure. Thus, the conductor structure may be applied in display devices of general size and also in display devices of large size.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A conductor structure, comprising:
a bottom conductor layer;
a first metal layer disposed on the bottom conductor layer, wherein an edge of the bottom conductor layer is protruded beyond an edge of the first metal layer by a distance, and the distance is greater than 0 and less than or equal to 1 μm;
a second metal layer disposed on the first metal layer, wherein a material of the first metal layer is same as a material of the second metal layer;
a controlling layer disposed between the first metal layer and the second metal layer; and
a top conductor layer disposed on the second metal layer, wherein a thickness of the bottom conductor layer is less than a thickness of the first metal layer, the thickness of the first metal layer is greater than a thickness of the controlling layer, the thickness of the controlling layer is less than a thickness of the second metal layer, and the thickness of the second metal layer is greater than a thickness of the top conductor,
wherein a material of the top conductor layer and a material of the bottom conductor layer are different from the materials of the first metal layer and the second metal layer, and a material of the controlling layer comprises molybdenum nitride,
wherein a sidewall of the conductor structure has a taper profile, and
wherein an etching rate of an etchant to the top conductor layer is larger than an etching rate of the etchant to the second metal layer, the etching rate of the etchant to the second metal layer is larger than an etching rate of the etchant to the controlling layer, the etching rate of the etchant to the controlling layer is larger than an etching rate of the etchant to the first metal layer, and the etching rate of the etchant to the first metal layer is larger than an etching rate of the etchant to the bottom conductor layer.

2. The conductor structure according to claim 1, wherein a thickness difference between the first metal layer and the second metal layer is less than or equal to 500 Å.

3. The conductor structure according to claim 1, wherein the first metal layer comprises aluminum or copper.

4. The conductor structure according to claim 1, wherein a width of the conductor structure is gradually decreased from the bottom conductor layer to the top conductor layer in a cross-sectional view.

5. A display device, comprising:
a first substrate;
a second substrate disposed opposite to the first substrate; and
a conductor structure disposed between the first substrate and the second substrate, the conductor structure comprising:

a bottom conductor layer disposed on the first substrate;

a first metal layer disposed on the bottom conductor layer, and the bottom conductor layer disposed between the first substrate and the first metal layer, wherein an edge of the bottom conductor layer is protruded beyond an edge of the first metal layer by a distance, and the distance is greater than 0 and less than or equal to 1 μm;

a second metal layer disposed on the first metal layer, wherein a material of the first metal layer is same as a material of the second metal layer;

a controlling layer disposed between the first metal layer and the second metal layer; and a top conductor layer disposed on the second metal layer, wherein a thickness of the bottom conductor layer is less than a thickness of the first metal layer, the thickness of the first metal layer is greater than a thickness of the controlling layer, the thickness of the controlling layer is less than a thickness of the second metal layer, and the thickness of the second metal layer is greater than a thickness of the top conductor, wherein a material of the top conductor layer and a material of the bottom conductor layer are different from the materials of the first metal layer and the second metal layer, and a material of the controlling layer comprises molybdenum nitride, and wherein a sidewall of the conductor structure has a taper profile, and wherein an etching rate of an etchant to the top conductor layer is larger than an etching rate of the etchant to the second metal layer, the etching rate of the etchant to the second metal layer is larger than an etching rate of the etchant to the controlling layer, the etching rate of the etchant to the controlling layer is larger than an etching rate of the etchant to the first metal layer, and the etching rate of the etchant to the first metal layer is larger than an etching rate of the etchant to the bottom conductor layer.

6. The display device according to claim 5, wherein a thickness difference between the first metal layer and the second metal layer is less than or equal to 500 Å.

7. The display device according to claim 5, wherein the first substrate is an array substrate, and the conductor structure is disposed on the first substrate.

8. The display device according to claim 5, further comprising a display medium disposed between the first substrate and the second substrate.

9. The display device according to claim 5, further comprising a sensing component layer disposed between the first substrate and the second substrate.

10. The display device according to claim 5, wherein the first metal layer comprises aluminum or copper.

11. The display device according to claim 5, wherein the second metal layer comprises aluminum or copper.

* * * * *